US011121158B2

(12) United States Patent
Ammo et al.

(10) Patent No.: US 11,121,158 B2
(45) Date of Patent: Sep. 14, 2021

(54) SOLID-STATE IMAGE PICKUP APPARATUS AND ELECTRONIC EQUIPMENT

(71) Applicant: SONY SEMICONDUCTOR SOLUTIONS CORPORATION, Kanagawa (JP)

(72) Inventors: Hiroaki Ammo, Kanagawa (JP); Hirokazu Ejiri, Kanagawa (JP); Akiko Honjo, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/496,619

(22) PCT Filed: Mar. 16, 2018

(86) PCT No.: PCT/JP2018/010392
§ 371 (c)(1),
(2) Date: Sep. 23, 2019

(87) PCT Pub. No.: WO2018/180574
PCT Pub. Date: Oct. 4, 2018

(65) Prior Publication Data
US 2020/0020728 A1 Jan. 16, 2020

(30) Foreign Application Priority Data
Mar. 31, 2017 (JP) .............................. JP2017-071599

(51) Int. Cl.
*H01L 29/06* (2006.01)
*H01L 29/78* (2006.01)
(Continued)

(52) U.S. Cl.
CPC .. *H01L 27/14616* (2013.01); *H01L 27/11807* (2013.01); *H01L 27/146* (2013.01);
(Continued)

(58) Field of Classification Search
CPC ............. H01L 27/307; H01L 27/14643; H01L 27/146; H01L 27/1464; H01L 27/14616;
(Continued)

(56) References Cited

U.S. PATENT DOCUMENTS

2010/0116976 A1   5/2010  Wober
2011/0133160 A1*  6/2011  Yu ................... H01L 31/035227
                                                    257/14
(Continued)

FOREIGN PATENT DOCUMENTS

CN         103201858 A      7/2013
CN         104981906 A     10/2015
(Continued)

OTHER PUBLICATIONS

Kusuhara, et al., "Analysis and Reduction of Floating Diffusion Capacitance Components of CMOS Image Sensor for Photon-Countable Sensitivity", Proceedings of International Image Sensor Workshop, 2015, 04 pages.

(Continued)

*Primary Examiner* — Galina G Yushina
(74) *Attorney, Agent, or Firm* — Chip Law Group

(57) ABSTRACT

The present technology relates to a solid-state image pickup apparatus and electronic equipment that makes it possible to suppress read noise. A solid-state image pickup apparatus according to a first aspect of the present technology includes a photoelectric conversion section that generates and holds a charge in response to incident light, a transfer section that includes a V-NW transistor (Vertical Nano Wire transistor) and transfers the charge held in the photoelectric conversion section, and an accumulation section that includes a wiring layer connected to a drain of the transfer section including the V-NW transistor and accumulates the charge transferred (Continued)

by the transfer section. The present technology is applicable to a CMOS image sensor, for example.

8 Claims, 14 Drawing Sheets

(51) Int. Cl.
  *H01L 27/30* (2006.01)
  *H01L 27/146* (2006.01)
  *H01L 29/10* (2006.01)
  *H01L 27/118* (2006.01)
(52) U.S. Cl.
  CPC ........ *H01L 27/1464* (2013.01); *H01L 27/307* (2013.01); *H01L 29/0676* (2013.01); *H01L 29/1037* (2013.01); *H01L 29/7827* (2013.01); *H01L 2924/13086* (2013.01); *Y10S 977/938* (2013.01)
(58) Field of Classification Search
  CPC ............. H01L 27/14641; H01L 27/088; H01L 27/092; H01L 29/0676; H01L 29/1036; H01L 29/7827; H01L 29/775; H01L 29/66666; H01L 29/7802; H01L 29/78642; H01L 29/66712; H01L 29/66742; H01L 21/8234; H01L 21/8238; H01L 2924/13086; Y10S 977/938; B82Y 15/00; B82Y 10/00; H04N 5/374
  See application file for complete search history.

(56) References Cited

U.S. PATENT DOCUMENTS

| | | | | |
|---|---|---|---|---|
| 2011/0226937 A1* | 9/2011 | Yu | .................... | H01L 31/056 250/216 |
| 2011/0253982 A1* | 10/2011 | Wang | ................. | H01L 27/0605 257/24 |
| 2013/0307053 A1* | 11/2013 | Polishchuk | ........ | G11C 16/0466 257/325 |
| 2015/0035028 A1 | 2/2015 | Fan et al. | | |
| 2016/0020237 A1 | 1/2016 | Yamakawa | | |
| 2016/0150168 A1* | 5/2016 | Oh | .................... | H01L 27/14645 348/302 |

FOREIGN PATENT DOCUMENTS

| | | |
|---|---|---|
| CN | 105706240 A | 6/2016 |
| CN | 106033762 A | 10/2016 |
| CN | 107408567 A | 11/2017 |
| JP | 2015-097284 A | 5/2015 |
| JP | 2016-195229 A | 11/2016 |
| JP | 2016-534557 A | 11/2016 |
| KR | 10-2013-0113480 A | 10/2013 |
| KR | 10-2016-0033231 A | 3/2016 |
| KR | 10-2016-0060997 A | 5/2016 |
| TW | 201143056 A | 12/2011 |
| TW | 201515202 A | 4/2015 |
| WO | 2011/087633 A1 | 7/2011 |
| WO | 2014/141900 A1 | 9/2014 |
| WO | 2015/020821 A2 | 2/2015 |
| WO | 2016/158440 A1 | 10/2016 |

OTHER PUBLICATIONS

Boukhayma, et al., "Noise Reduction Techniques and Scaling Effects Towards Photon Counting CMOS Image Sensors", Multidisciplinary Digital Publishing Institute (MDPI), vol. 16, No. 4, Apr. 9, 2016, pp. 1-19.

Kusuhara, et al., "Analysis and Reduction of Floating Diffusion Capacitance Components of CMOS Image Sensor for Photon-Countable Sensitivity", Proceedings of international image sensor workshop, Jun. 2015, 04 pages.

Boukhayma, et al., "Noise Reduction Techniques and Scaling Effects towards Photon Counting CMOS Image Sensor", Sensors, vol. 16, No. 4, Apr. 9, 2016, 19 pages.

International Search Report and Written Opinion of PCT Application No. PCT/JP2018/010392, dated May 1, 2018, 10 pages of ISRWO.

* cited by examiner

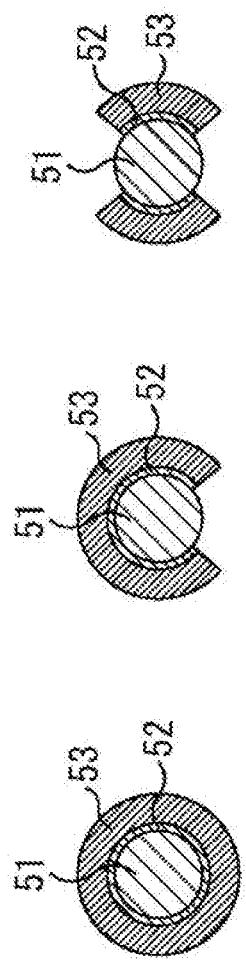
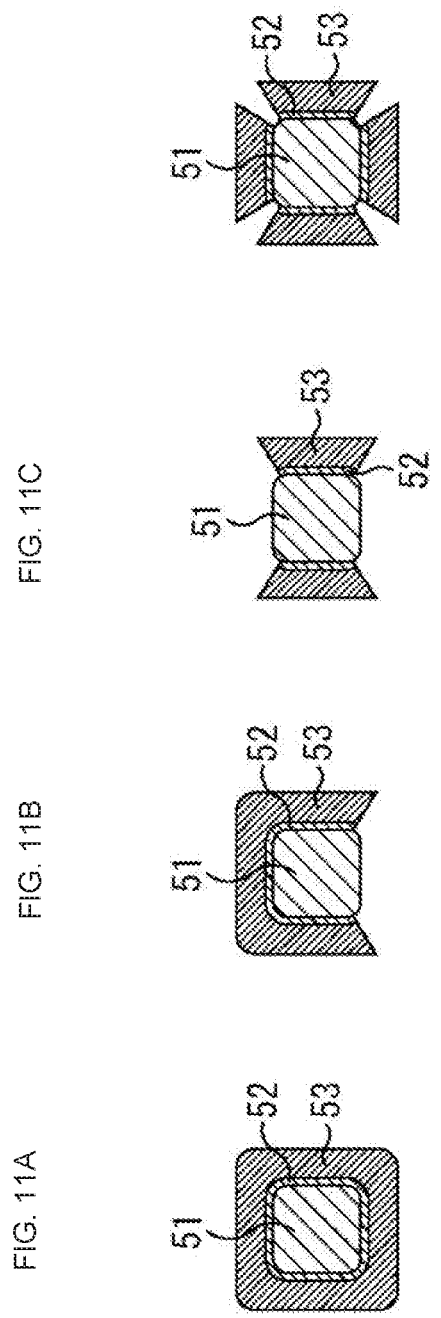
FIG. 11A
FIG. 11B
FIG. 11C
FIG. 11D
FIG. 11E
FIG. 11F
FIG. 11G

SOLID-STATE IMAGE PICKUP APPARATUS AND ELECTRONIC EQUIPMENT

CROSS REFERENCE TO RELATED APPLICATIONS

This application is a U.S. National Phase of International Patent Application No. PCT/JP2018/010392 filed on Mar. 16, 2018, which claims priority benefit of Japanese Patent Application No. JP 2017-071599 filed in the Japan Patent Office on Mar. 31, 2017. Each of the above-referenced applications is hereby incorporated herein by reference in its entirety.

TECHNICAL FIELD

The present technology relates to a solid-state image pickup apparatus and electronic equipment, and more particularly, to a solid-state image pickup apparatus in which a transistor is formed by use of a V-NW (Vertical Nano Wire) and electronic equipment.

BACKGROUND ART

Presently, in a development field of a CMOS image sensor, for example, various noise reduction techniques have been suggested in order to implement photo counting for detecting weak light in units of photon. Hereinafter, read noise that becomes a hindrance in the case of performing the photo counting or the like will be described.

FIG. 1 is an equivalent circuit diagram depicting a general configuration example of a 4-transistor type CIS (CMOS Image Sensor) that becomes mainstream as a structure of a CMOS Image Sensor. As depicted in FIG. 1, the 4-transistor type CIS has a PD (photodiode) 11 as a photoelectric conversion section, a transfer gate transistor 12, a charge accumulation section 13, an amplification transistor 14, a selection transistor 15, and a reset transistor 17.

FIG. 2 depicts a cross-sectional diagram in the case of using a planar transistor in which four types of transistors of the 4-transistor type CIS depicted in FIG. 1 are formed in a planar shape on a Si substrate.

In the case of FIG. 2, the charge accumulation section 13 is formed by a floating diffusion layer (hereinafter, referred to as an FD (floating diffusion)). Hereinafter, the charge accumulation section 13 is also referred to as an FD 13. Further, a drain of the amplification transistor 14 and a source of the selection transistor 15 are connected via an n-type diffusion layer 16.

Meanwhile, it is known that capacitance around the FD 13 or each transistor causes read noise that may be generated in the 4-transistor type CIS depicted in FIGS. 1 and 2. Particularly, it is known that the capacitance around the FD 13 largely contributes to the read noise and reduction in the capacitance around the FD 13 permits read noise to be suppressed (for example, see NPL 1).

With regard to the capacitance around the FD 13, it is known that the capacitance of the PN junction forming the FD 13 may occupy approximately 40% of the capacitance around the FD 13 (for example, see NPL 2).

CITATION LIST

Non Patent Literature

NPL 1

"Noise Reduction Techniques and Scaling Effects towards Photon Counting CMOS Image Sensors" [Ref. 1: Sensors 2016, 16, 514]

NPL 2

"Analysis and Reduction of Floating Diffusion Capacitance Components of CMOS Image Sensor for Photon-Countable Sensitivity" [Ref. 2: Proc. IISW 2015, pp 120-123]

SUMMARY

Technical Problems

As described above, the capacitance of the PN junction forming the FD 13 occupies a large portion of the capacitance around the FD 13. Therefore, when the capacitance of the PN junction is reduced, it is possible to suppress the read noise in the 4-transistor type CIS. However, since the FD 13 is realized by forming the PN junction on the Si substrate, the reduction is limited. Accordingly, even suppression of the read noise is limited.

Further, the FD 13 is formed by the PN junction, and thereby a leakage current cannot be eliminated between a P-type area and an N-type area of the PN junction, so that generation of a dark current is also caused.

Note that the above-described problem is not limited to the 4-transistor type CIS, but common to a CIS having an FD.

The present technology has been made in view of such circumstances and is capable of suppressing read noise due to the FD.

Solution to Problems

A solid-state image pickup apparatus according to a first aspect of the present disclosure includes a photoelectric conversion section that generates and holds a charge in response to incident light; a transfer section that includes a V-NW transistor and transfers the charge held in the photoelectric conversion section; and an accumulation section that includes a wiring layer connected to a drain of the transfer section including the V-NW transistor and accumulates the charge transferred by the transfer section.

The accumulation section can include the wiring layer having no PN junction.

The solid-state image pickup apparatus according to the first aspect of the present disclosure can further include a reset section that resets the charge accumulated in the accumulation section; an amplification section that provides the charge accumulated in the accumulation section as an electrical signal; and a selection section that selectively outputs the electrical signal converted by the amplification section to a latter part, in which at least one of the reset section, the amplification section, or the selection section can include a V-NW transistor.

The solid-state image pickup apparatus according to the first aspect of the present disclosure can further include an insulating film formed between the photoelectric conversion section and a gate of the V-NW transistor forming the transfer section.

The insulating film formed between the photoelectric conversion section and the gate of the V-NW transistor forming the transfer section can be an impurity-containing insulating film.

In a surface of a source of the V-NW transistor forming the transfer section connected to the photoelectric conversion section, a Fermi level can be pinned by an impurity diffused from the impurity-containing insulating film.

The V-NW transistor can be obtained by forming a semiconductor pillar having a diameter of 50 nm or less in a vertical direction with respect to a substrate in a state in which one end of the semiconductor pillar serves as a source, another end thereof serves as a drain, and a gate which controls a conduction state is formed in an outer circumference of the semiconductor pillar.

Electronic equipment according to a second aspect of the present disclosure is mounted with the solid-state image pickup apparatus including a photoelectric conversion section that generates and holds a charge in response to incident light; a transfer section that includes a V-NW transistor and transfers the charge held in the photoelectric conversion section; and an accumulation section that includes a wiring layer connected to a drain of the transfer section including the V-NW transistor and accumulates the charge transferred by the transfer section.

The V-NW transistor can be obtained by forming a semiconductor pillar having a diameter of 50 nm or less in a vertical direction with respect to a substrate in a state in which one end of the semiconductor pillar serves as a source, another end thereof serves as a drain, and a gate which controls a conduction state is formed in an outer circumference of the semiconductor pillar.

A solid-state image pickup apparatus according to a third aspect of the present disclosure includes a photoelectric conversion section that generates and holds a charge in response to incident light; a transfer section that transfers the charge held in the photoelectric conversion section; an accumulation section that accumulates the charge transferred by the transfer section; a reset section that resets the charge accumulated in the accumulation section; an amplification section that provides the charge accumulated in the accumulation section as an electrical signal; and a selection section that selectively outputs the electrical signal converted by the amplification section to a latter part, in which at least one of the transfer section, the reset section, the amplification section, or the selection section includes a V-NW transistor.

A solid-state image pickup apparatus according to a fourth aspect of the present disclosure includes a photoelectric conversion section that is formed in a substrate; a transistor that transfers a charge generated in the photoelectric conversion section; and a wiring layer that is formed on the substrate and connected to the transistor, in which the transistor has a semiconductor area extending in a vertical direction with respect to the substrate, an insulating film formed around the semiconductor area, and a gate formed with the insulating film interposed between the gate and the semiconductor area.

The semiconductor area can be formed cylindrically, and one end of the semiconductor area can be connected to the wiring layer and another end of the semiconductor area can be connected to the photoelectric conversion section.

The charge can be accumulated in capacitance formed between the wiring layer and the substrate.

Advantageous Effects of Invention

According to the present technology, it is possible to suppress read noise.

According to the present technology, it is possible to improve an area rate of the photoelectric conversion section in the solid-state image pickup apparatus.

BRIEF DESCRIPTION OF DRAWINGS

FIGS. 11A, 11B, 11C, 11D, 11E, 11F, and 11G are diagrams depicting an example of a shape capable of being adopted by a semiconductor pillar and a gate electrode.

DESCRIPTION OF EMBODIMENT

Hereinafter, a best mode (hereinafter, referred to as an embodiment) for carrying out the present technology will be described in detail with reference to the drawings.

<Configuration Example of Solid-State Image Pickup Apparatus According to Present Embodiment>

Figure 1:
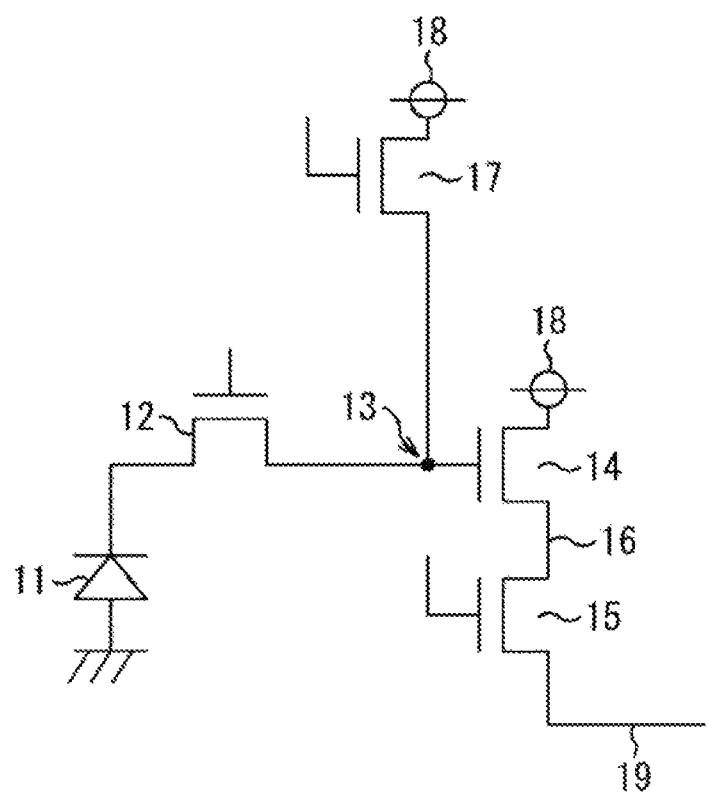
FIG. 1 is an equivalent circuit diagram depicting a general configuration example of a 4-transistor type CIS.
Figure 3:
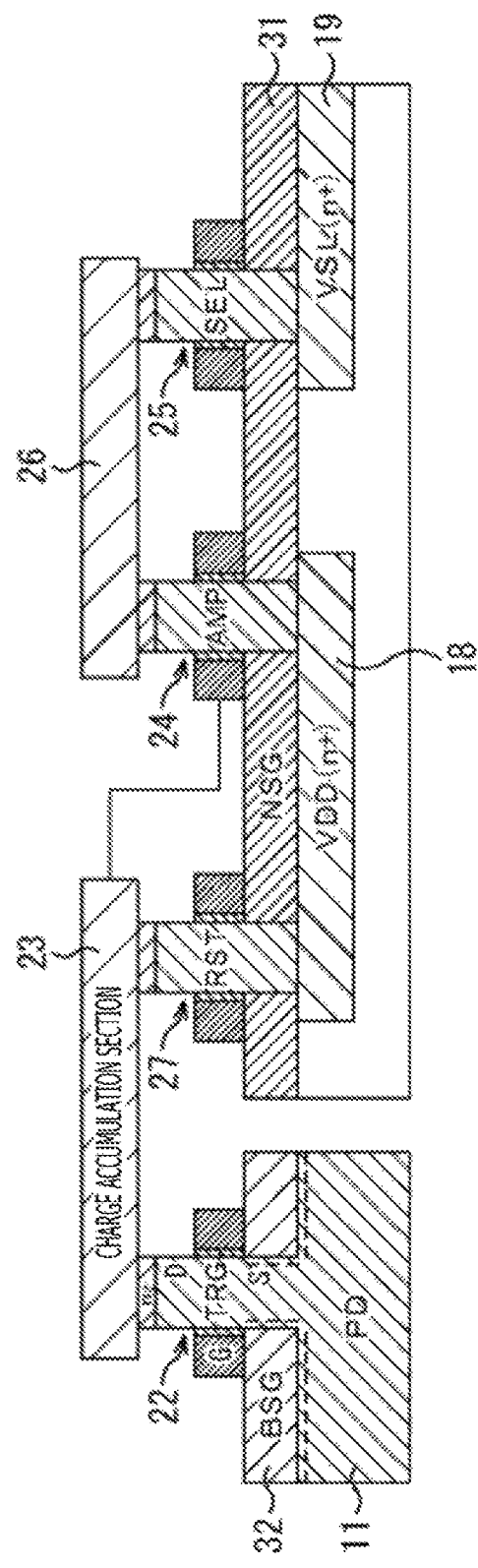
FIG. 3 is a vertical cross-sectional diagram depicting a solid-state image pickup apparatus to which the present technology is applied.

A solid-state image pickup apparatus according to the present embodiment is realized by using a V-NW transistor in which each transistor of a 4-transistor type CIS depicted in FIG. 1 is formed on a Si substrate in a vertical direction. FIG. 3 is a vertical cross-sectional diagram indicating a configuration example of the solid-state image pickup apparatus, and FIG. 4 is a top view diagram depicting a configuration example of the solid-state image pickup apparatus.

Figure 4:
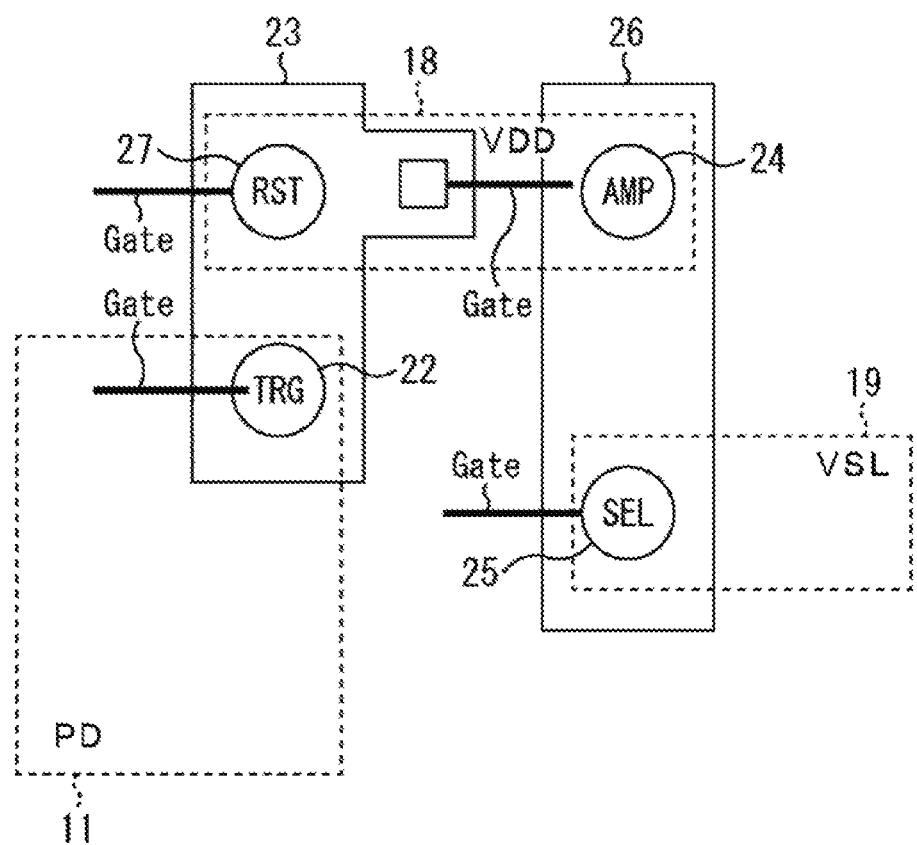
FIG. 4 is a top view diagram depicting the solid-state image pickup apparatus to which the present technology is applied.

Note that an equivalent circuit of the solid-state image pickup apparatus according to the present embodiment depicted in FIGS. 3 and 4 is common to that depicted in FIG. 1. The solid-state image pickup apparatus according to the present embodiment is a 4-transistor type, and further, the present technology is applicable to the solid-state image pickup apparatus other than the 4-transistor type. Further, the solid-state image pickup apparatus according to the present embodiment may be any one of a front-illuminated type and a back-illuminated type.

Here, the V-NW transistor is a transistor obtained by forming a semiconductor pillar having a diameter of 50 nm or less, preferably 30 nm or less and extending in a vertical direction with respect to a substrate in a state in which one end of the semiconductor pillar serves as a source (S), another end thereof serves as a drain (D), and a gate (G) which controls a conduction state is formed in an outer circumference of the semiconductor pillar. Note that one transistor may be formed by a piece of V-NW or by a plurality of V-NWs formed in parallel.

Specifically, a transfer gate transistor (TRG) 22, an amplification transistor (AMP) 24, a selection transistor (SEL) 25, and a reset transistor (RST) 27 each including the V-NW transistor depicted in FIG. 3 correspond to the transfer gate transistor 12, the amplification transistor 14, the selection transistor 15, and the reset transistor 17 in an equivalent circuit depicted in FIG. 1, respectively.

In the transfer gate transistor 22 including the V-NW transistor, a source that is one end of the semiconductor pillar is connected to the PD 11 formed on the Si substrate. Further, a drain that is another end of the semiconductor pillar is connected to a charge accumulation section 23 via a contact including an n-type diffusion area (n+). A gate electrode 53 (FIG. 7) is formed via a gate insulating film 52 (FIG. 7) in the outer circumference of a semiconductor pillar gate of the transfer gate transistor 22. An insulating film 32 is formed between the gate electrode 53 and the PD 11. A boron-containing silicon oxide film (BSG: Boro-Silicate Glass) is applicable to the insulating film 32, for example.

Figure 2:
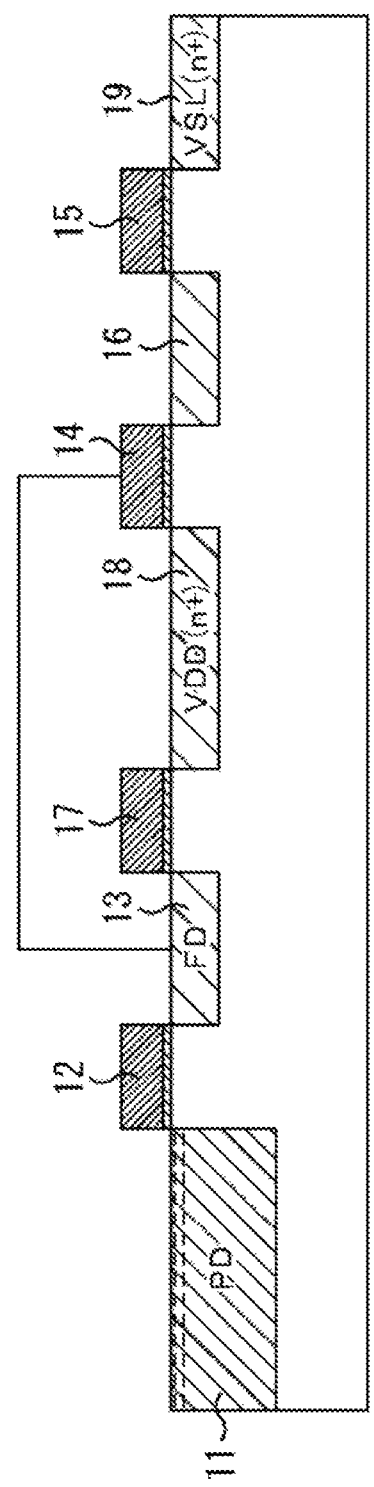
FIG. 2 is a vertical cross-sectional diagram in the case of forming the 4-transistor type CIS by using a planar transistor.

The charge accumulation section 23 corresponds to the charge accumulation section 13 in the equivalent circuit depicted in FIG. 1. Note, however, that, in a previous configuration depicted in FIG. 2, the charge accumulation section 13 is an FD; further, in the solid-state image pickup apparatus, the charge accumulation section 23 is formed by a wiring layer of Top Plate. A drain of the transfer gate transistor 22 that is the V-NW transistor and a source of the reset transistor 27 that is the V-NW transistor are connected to the charge accumulation section 23 including the wiring layer. In addition, the charge accumulation section 23 including the wiring layer is connected to a gate electrode of the amplification transistor 24 that is the V-NW transistor.

A source of the reset transistor 27 that is the V-NW transistor is connected to the charge accumulation section 23 and a drain thereof is connected to a power supply VDD (not depicted) via an n-type diffusion layer (VDD(n+)) 18 formed within the Si substrate.

A drain of the amplification transistor 24 that is the V-NW transistor is connected to a source of the selection transistor 25 via a wiring layer 26 of Top Plate. A drain of the selection transistor 25 that is the V-NW transistor is connected to a vertical signal line VSL (not depicted) via an n-type diffusion layer (VSL(n+)) 19 formed in the Si substrate.

An insulating film 31 is formed between the n-type diffusion layer 18 and each gate electrode of the amplification transistor 24 and the reset transistor 27, and between the n-type diffusion layer 19 and a gate electrode of the selection transistor 25. A silicon dioxide film (NSG: No doped Silicate Glass) is applicable to the insulating film 31, for example.

In the solid-state image pickup apparatus according to the present embodiment depicted in FIG. 3, the charge accumulation section 23 is aimed at being formed by using the wiring layer having no PN junction in place of the FD having the PN junction. Thereby, the capacitance around the FD or each transistor that causes read noise can be largely reduced in comparison with a past case in which the charge accumulation section 13 is formed by the FD, and therefore read noise can be suppressed. Further, a leakage current is not generated in the PN junction, and therefore a dark current can be suppressed from being generated.

Further, each transistor is formed by using the V-NW transistor to thereby make an occupied area of each transistor small in comparison with a past case in which each transistor is formed by using a planar transistor. Further, the drain of the amplification transistor 24 and the source of the selection transistor 25 are connected via the wiring layer 26, and thereby the amplification transistor 24 and the selection transistor 25 can be compactly arranged. As described above, through miniaturization of each transistor or a device of an arrangement, an area ratio of the PD 11 in the solid-state image pickup apparatus can be improved, and further, the number of saturated electrons and light sensitivity of the PD 11 can be improved.

<Method for Manufacturing Solid-State Image Pickup Apparatus According to Present Embodiment>

Next, a method for manufacturing the solid-state image pickup apparatus will be described with reference to FIGS. 5 to 8. FIGS. 5 to 8 are vertical cross-sectional diagrams depicting a manufacturing process of the solid-state image pickup apparatus.

Figure 5:
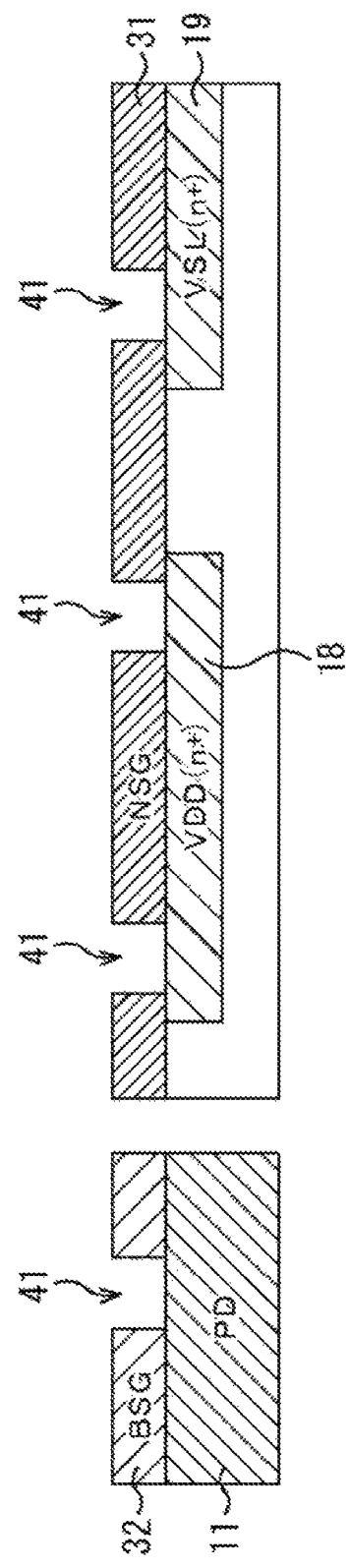
FIG. 5 is a vertical cross-sectional diagram depicting a manufacturing process of the solid-state image pickup apparatus to which the present technology is applied.

In the beginning, as depicted in FIG. 5, the PD 11 is formed on the Si substrate, and further, the n-type diffusion layer 18 connected to the power supply VDD and the n-type diffusion layer 19 connected to the vertical signal line VSL are formed. Afterwards, for example, BSG is formed on the PD 11 as the insulating film 32. Further, for example, NSG is formed on the n-type diffusion layers 18 and 19 as the insulating film 31. In place of BSG, NSG may be formed as the insulating film 32 on the PD 11. Further, an opening part 41 is formed in a position in which each V-NW transistor of the insulating films 31 and 32 is formed.

Figure 6:
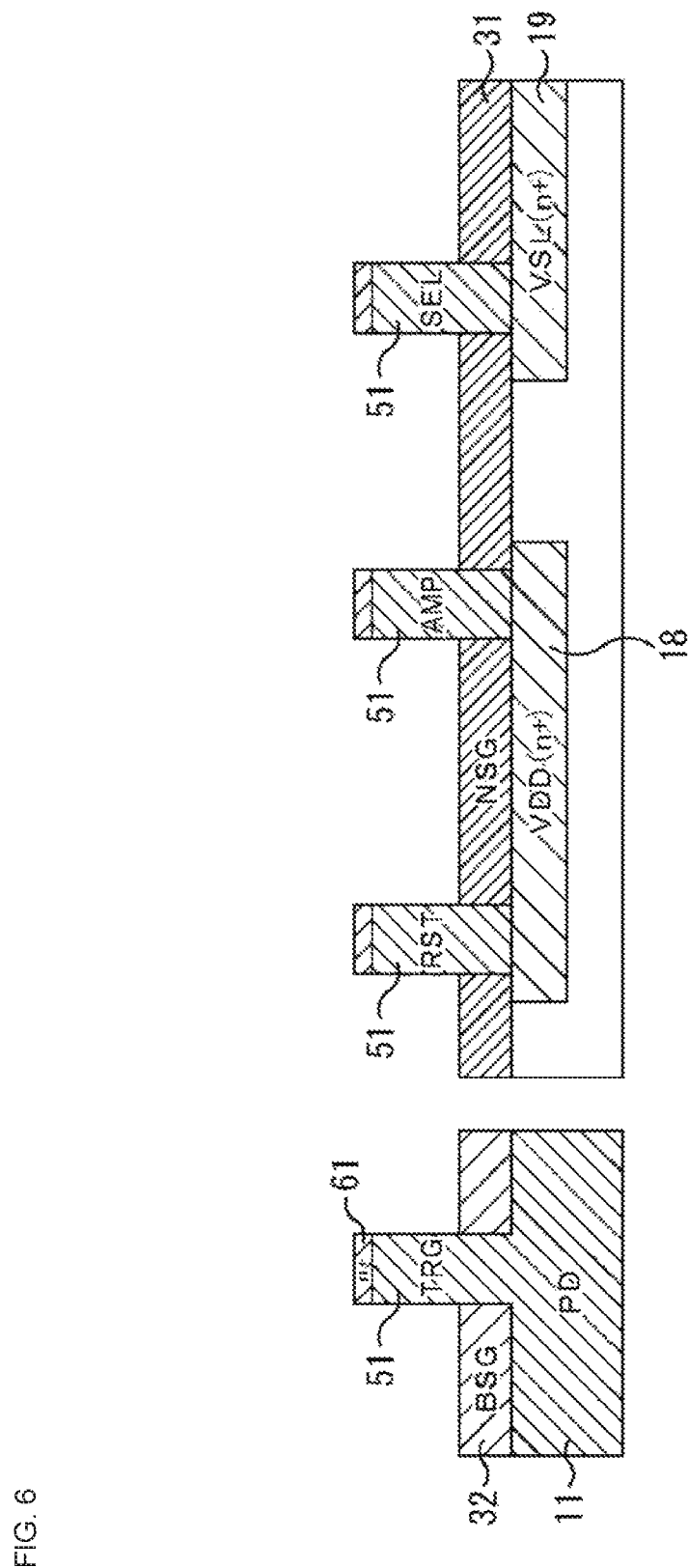
FIG. 6 is a vertical cross-sectional diagram depicting the manufacturing process of the solid-state image pickup apparatus to which the present technology is applied.

Next, as depicted in FIG. 6, the semiconductor pillars 51 each forming the V-NW through a selective epitaxial growth are formed in the opening parts 41 formed in the insulating films 31 and 32.

Note that a specific forming method for the V-NW is arbitrary. A method described in "Vertical Silicon Nanowire Field Effect Transistors with nanoscale Gate-All-Around" [Ref. 3: Nanoscale Research Letters 2016 11:210] is applicable to the above method, for example. Alternatively, the selective epitaxial growth using Au etc. described in "Realization of a Silicon Nanowire Vertical Surround-Gate Field Effect Transistors" [Ref. 4: small 2006, 2, No. 1 pp 85-88] may be used for the above method, for example.

In a lower part of the semiconductor pillar 51 forming the V-NW as the transfer gate 22, a concentration gradient may be made so as to easily transfer charges from the PD 11.

In an upper part of each semiconductor pillar 51, the n-type diffusion area 61 is formed as a contact to be connected to the wiring layer 26 or the charge accumulation section 23 as a wiring layer.

Figure 7:
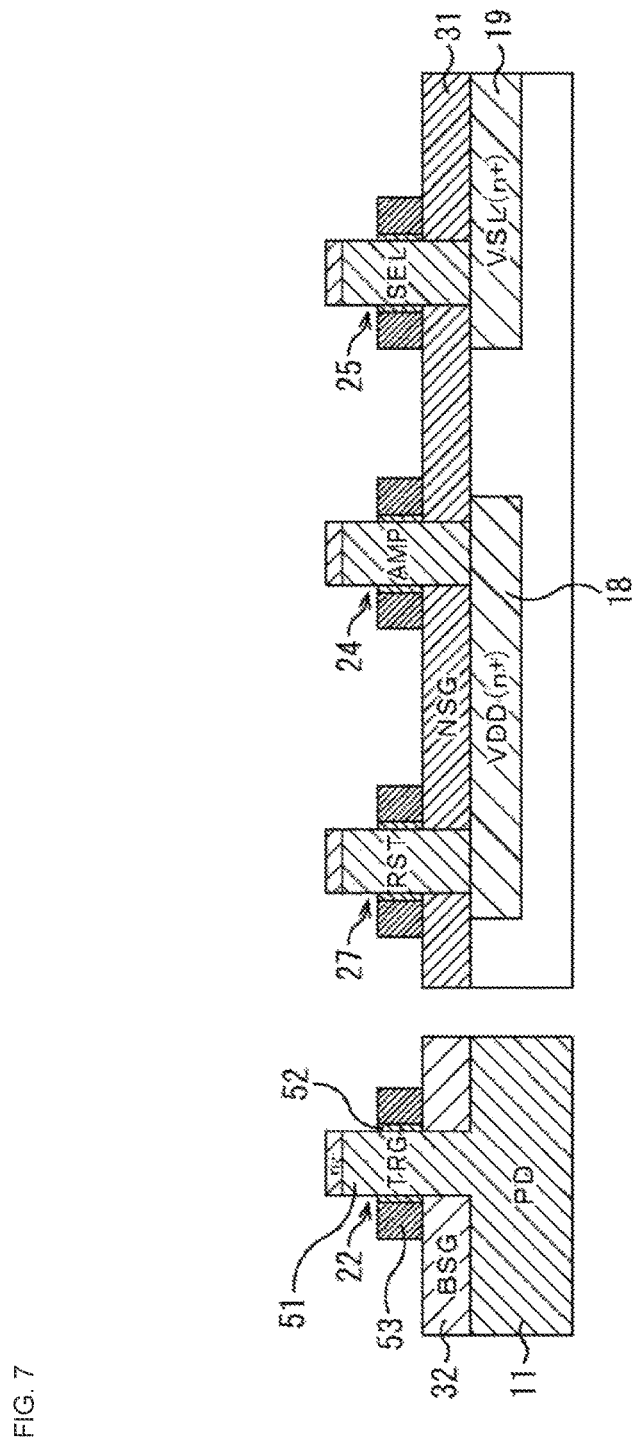
FIG. 7 is a vertical cross-sectional diagram depicting the manufacturing process of the solid-state image pickup apparatus to which the present technology is applied.

Next, as depicted in FIG. 7, the gate insulating film 52 is formed in the outer circumference of each semiconductor pillar 51. Then, the gate electrode 53 is formed in the outer circumference thereof and thereby the transfer gate transistor 22, the amplification transistor 24, the selection transistor 25, and the reset transistor 27 are formed as the V-NW transistor.

Figure 8:
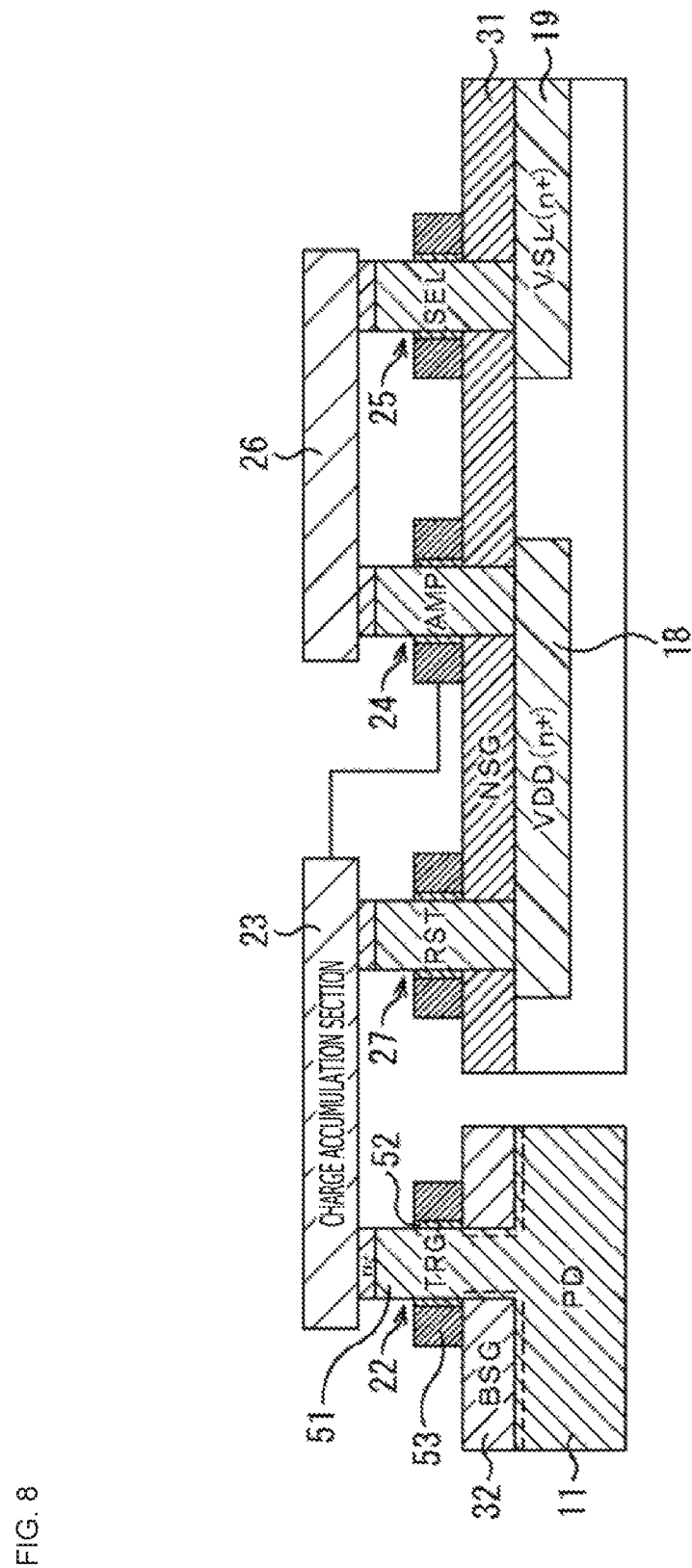
FIG. 8 is a vertical cross-sectional diagram depicting the manufacturing process of the solid-state image pickup apparatus to which the present technology is applied.

Lastly, an inter-film insulating film (not depicted) is formed on the n-type diffusion area 61 formed in an upper part of the semiconductor pillar 51. Then, as depicted in FIG. 8, the wiring layer 26 and the charge accumulation section 23 as a wiring layer are formed.

Note that in the case in which BSG is used as the insulating film 32 on the PD 11, B (boron) is diffused from the BSG 32. Therefore, the Fermi level on a surface of a source (lower part of the semiconductor pillar 51) of the transfer gate transistor 22 can be pinned, so that a dark current can be prevented from being generated from the pinned area.

Further, in the formation of the V-NW transistor, doping of impurities on an Si substrate required in a process of forming a previous planar transistor is not performed. Therefore, it is possible to reduce RTN (Random Telegraph Noise) in which a fluctuation of the doped impurities is supposed to be one of causes.

<Modifications>

Figure 9:
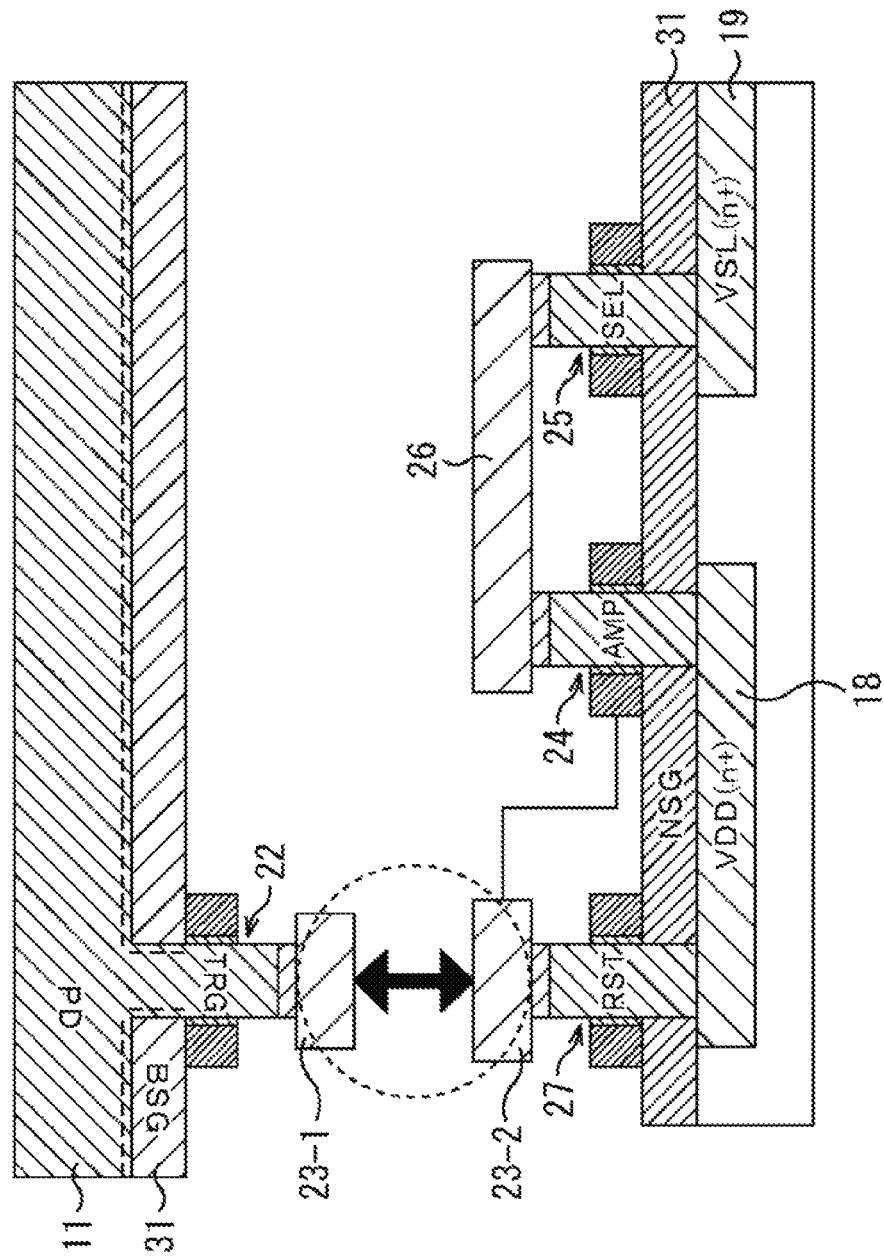
FIG. 9 is a vertical cross-sectional diagram depicting a first modification of the solid-state image pickup apparatus.

FIG. 9 is a vertical cross-sectional diagram depicting a first modification of the solid-state image pickup apparatus according to the present embodiment.

According to the first modification, the PD 11 and the transfer gate transistor 22 are formed on one substrate as a stacked type of stacking a plurality of semiconductor substrates and configuring the solid-state image pickup apparatus. Further, the other transistors (the amplification transistor 24, the selection transistor 25, and the reset transistor 26) are formed on another substrate that is stacked thereon. Further, the charge accumulation section 23 including the wiring layer is divided into charge accumulation sections 23-1 and 23-2. Further, each of the charge accumulation sections 23-1 and 23-2 is formed into a different stacked substrate. For example, contacts including Cu is formed in respective surfaces opposite to the charge accumulation sections 23-1 and 23-2 formed into different substrates. Then, both the contacts are joined and both the substrates are electrically connected. Note that the contacts are not limited to Cu but an arbitrary metal can be adopted.

According to the first modification, in addition to effects of the above-described solid-state image pickup apparatus according to the present embodiment, an effect of stacking substrates to thereby miniaturize the solid-state image pickup apparatus can be obtained.

Figure 10:
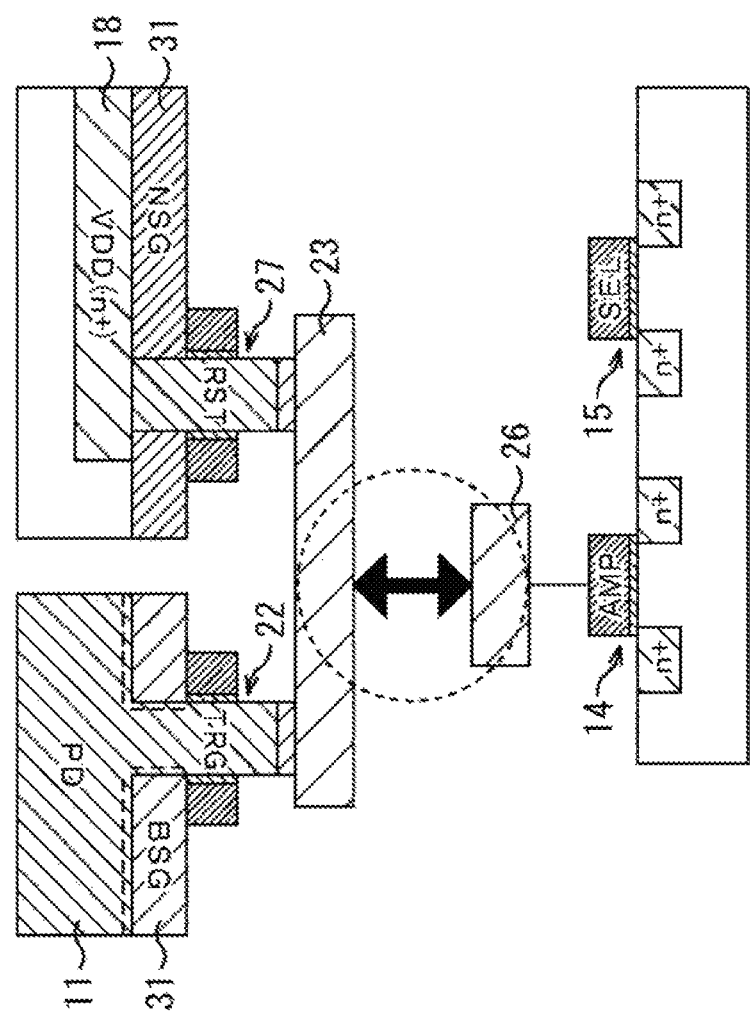
FIG. 10 is a vertical cross-sectional diagram depicting a second modification of the solid-state image pickup apparatus.

FIG. 10 is a vertical cross-sectional diagram depicting a second modification of the solid-state image pickup apparatus according to the present embodiment.

According to the second modification, as a stacked type of stacking a plurality of semiconductor substrates and configuring the solid-state image pickup apparatus, the V-NW transistor and the previous planar transistor are used for a structure of a pixel transistor at the same time.

Specifically, in one substrate, the PD 11, the transfer gate transistor 22 and reset transistor 27 including the V-NW transistor, and the charge accumulation section 23 are formed, and a contact including Cu is formed, for example, in the charge accumulation section 23. Further, the amplification transistor 14 and selection transistor 15 including the planar transistor are formed in another substrate that is stacked thereon. Further, the wiring layer 26 is formed on a drain of the amplification transistor 14 and a contact including Cu is formed, for example, on the wiring layer 26. Then, the contact of the charge accumulation section 23 and the contact of the wiring layer 26 are joined, and both of the substrates are electrically connected each other. Note that the contacts are not limited to Cu but an arbitrary metal can be adopted.

According to the second modification, in addition to effects of the above-described solid-state image pickup apparatus according to the present embodiment and the first modification, an effect capable of using the previous planar transistor at the same time can be obtained.

FIGS. 11A, 11B, 11C, 11D, 11E, 11F, and 11G depict an example of a shape that can be adopted by the semiconductor pillar 51 and gate electrode 53 that form the V-NW transistor.

FIG. 11A depicts an example in which the semiconductor pillar 51 has a columnar shape and the gate electrode 53 is formed in an annular shape in the outer circumference of the semiconductor pillar 51 with the insulating film 52 interposed therebetween. FIG. 11B depicts an example in which the semiconductor pillar 51 has the columnar shape and the gate electrode 53 is formed in such a shape as to occupy half or more of the annular shape in the outer circumference of the semiconductor pillar 51 with the insulating film 52 interposed therebetween and a remaining portion in the outer circumference of the semiconductor pillar 51 is not formed with the insulating film 52 and the gate electrode 53. FIG. 11C depicts an example in which the semiconductor pillar 51 has a columnar shape and the gate electrode 53 is formed in such a shape as to occupy half or more of the annular shape in the outer circumference of the semiconductor pillar 51 with the insulating film 52 interposed therebetween and two portions are not formed with the insulating film 52 and the gate electrode 53.

FIG. 11D depicts an example in which the semiconductor pillar 51 has a substantially rectangular columnar shape in which corners of a rectangular column are rounded and the gate electrode 53 is formed in a rectangular annular shape in the outer circumference of the semiconductor pillar 51 with the insulating film 52 interposed therebetween. FIG. 11E depicts an example in which the semiconductor pillar 51 has a substantially rectangular columnar shape and the gate electrode 53 is formed in such a shape as to occupy half or more of a rectangular annular shape in the outer circumference of the semiconductor pillar 51 with the insulating film 52 interposed therebetween and a remaining portion in the outer circumference of the semiconductor pillar 51 is not formed with the insulating film 52 and the gate electrode 53. FIG. 11F depicts an example in which the semiconductor pillar 51 has a substantially rectangular columnar shape and the gate electrode 53 is formed in such a shape as to occupy half or more of a rectangular annular shape in the outer circumference of the semiconductor pillar 51 with the insulating film 52 interposed therebetween and two portions are not formed with the insulating film 52 and the gate electrode 53. FIG. 11G depicts an example in which the semiconductor pillar 51 has a substantially rectangular columnar shape and the gate electrode 53 is formed in such a shape as to occupy half or more of a rectangular annular shape in the outer circumference of the semiconductor pillar 51 with the insulating film 52 interposed therebetween in a state in which the insulating film 52 and the gate electrode 53 is not formed at four corners.

Note that a shape capable of being adopted by the semiconductor pillar 51 and the gate electrode 53 is not limited to examples depicted in FIGS. 11A 11B 11C, 11D, 11E, 11F, and 11G. The above shape may be an elliptic column, a polygonal column of a triangular column or more, or a substantially polygonal column in which corners thereof are rounded.

<Application Example to In-Vivo Information Acquisition System>

The technology (the present technology) according to the present disclosure can be applied to various products. For example, the technology according to the present disclosure may be applied to an endoscopic operation system.

Figure 12:
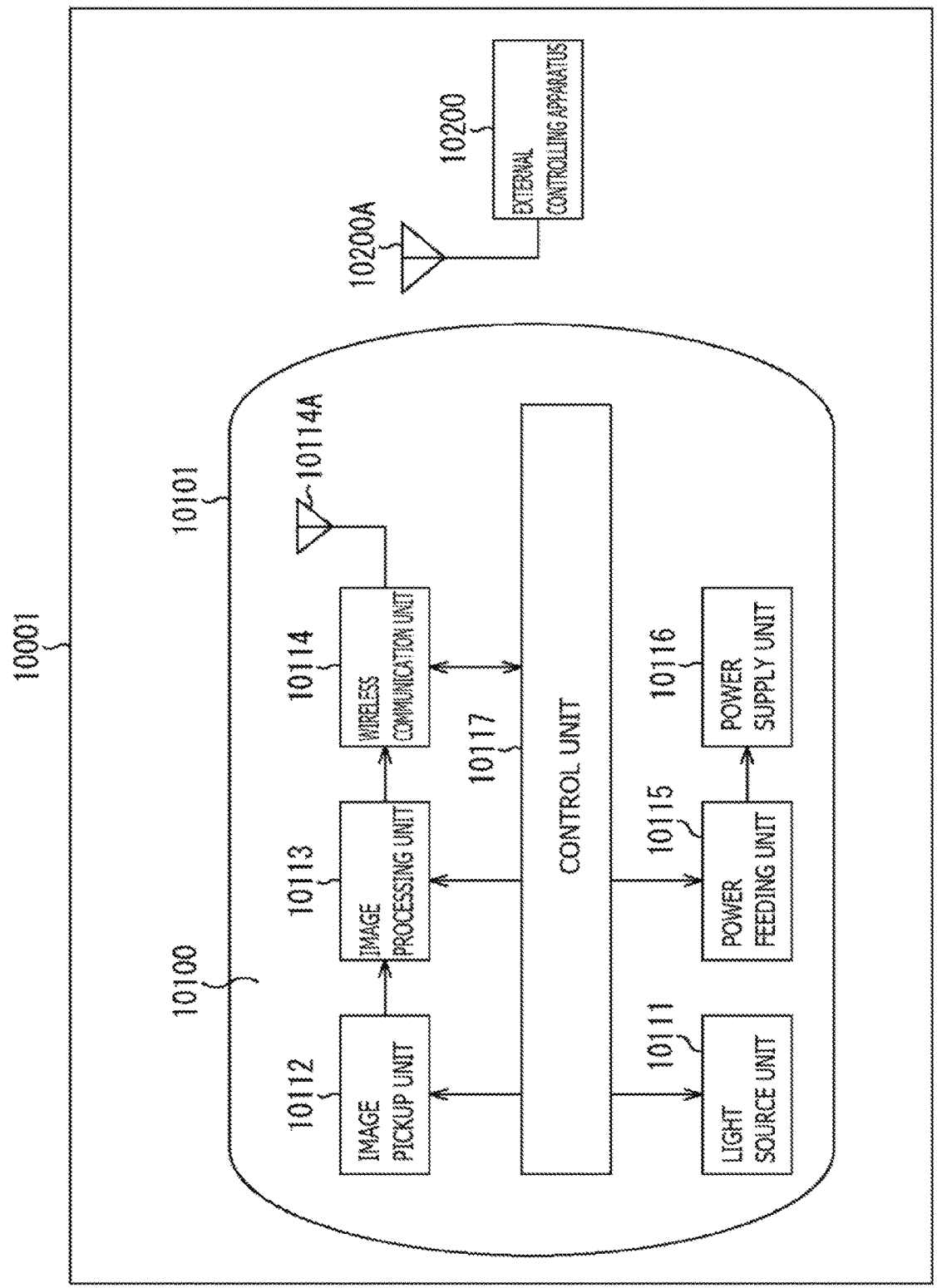
FIG. 12 is a block diagram depicting an example of a schematic configuration of an in-vivo information acquisition system.

FIG. 12 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 12, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

Heretofore, an example of the in-vivo information acquisition system to which the technology according to the present disclosure can be applied has been described. The technology according to the present disclosure can be applied to the image pickup unit 10112 among configurations described above.

<Application Examples to Moving Objects>

The technology (the present technology) according to the present disclosure can be applied to various products. For example, the technology according to the present disclosure may be realized as an apparatus that is mounted on any kind of moving objects including an automobile, an electric vehicle, a hybrid electric vehicle, a motorcycle, a bicycle, a personal mobility, an airplane, a drone, a ship, a robot, and the like.

Figure 13:
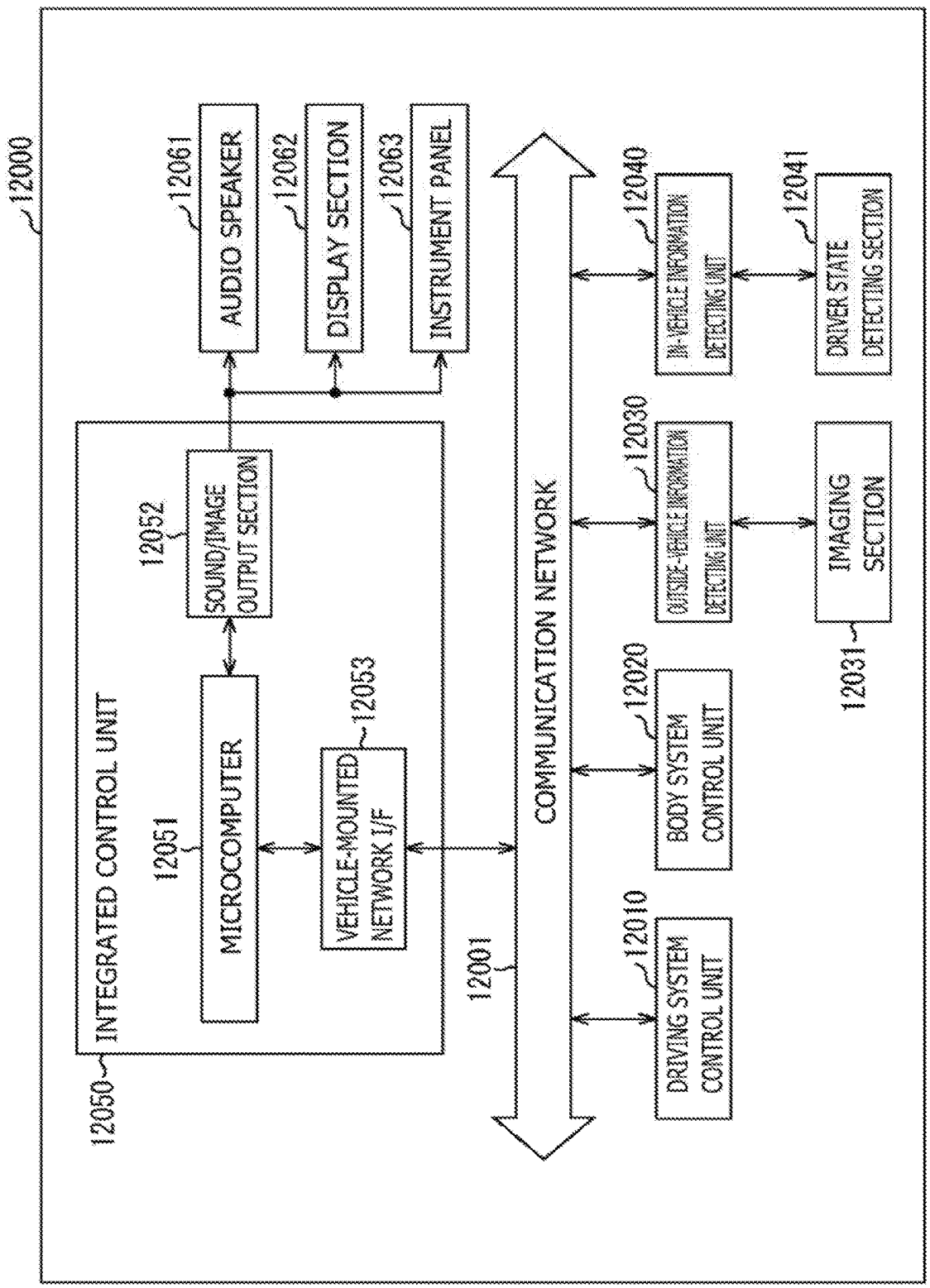
FIG. 13 is a block diagram depicting an example of schematic configuration of a vehicle control system.

FIG. 13 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 13, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 13, an audio speaker 12061, a display section 12062, and an instrument panel 12063 are illustrated as the output device. The display section 12062 may, for example, include at least one of an on-board display and a head-up display.

Figure 14:
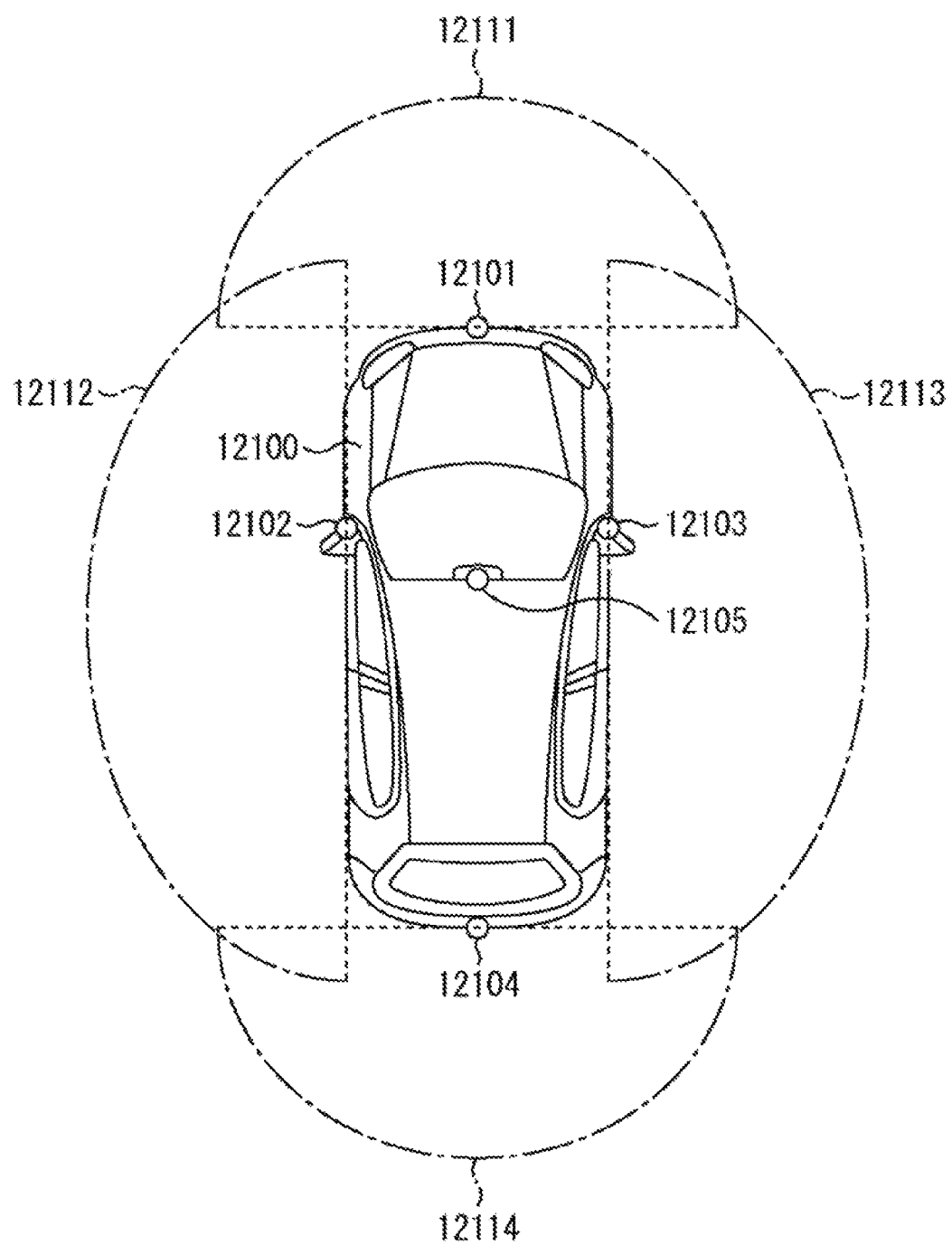
FIG. 14 is a diagram of assistance in explaining an example of installation positions of an outside-vehicle information detecting section and an imaging section.

FIG. 14 is a diagram depicting an example of the installation position of the imaging section 12031.

In FIG. 14, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 14 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Heretofore, an example of the vehicle control system to which the technology according to the present disclosure can be applied has been described. The technology according to the present disclosure can be applied to the imaging section 12031 among configurations described above.

Note that an embodiment of the present technology is not limited to those described above and can be modified in various ways without departing from the gist of the present technology.

The present technology can have the following configurations:

(1) A solid-state image pickup apparatus including:
a photoelectric conversion section that generates and holds a charge in response to incident light;
a transfer section that includes a V-NW transistor (Vertical Nano Wire transistor) and transfers the charge held in the photoelectric conversion section; and
an accumulation section that includes a wiring layer connected to a drain of the transfer section including the V-NW transistor and accumulates the charge transferred by the transfer section.

(2) The solid-state image pickup apparatus according to (1), in which the accumulation section includes the wiring layer having no PN junction.

(3) The solid-state image pickup apparatus according to (1) or (2), further including:
a reset section that resets the charge accumulated in the accumulation section;
an amplification a section that provides the charge accumulated in the accumulation section as an electrical signal; and
a selection section that selectively outputs the electrical signal converted by the amplification section to a latter part, in which at least one of the reset section, the amplification section, or the selection section includes a V-NW transistor.

(4) The solid-state image pickup apparatus according to any one of (1) to (3), further including:
an insulating film formed between the photoelectric conversion section and a gate of the V-NW transistor forming the transfer section.

(5) The solid-state image pickup apparatus according to (4), in which the insulating film formed between the photoelectric conversion section and the gate of the V-NW transistor forming the transfer section is an impurity-containing insulating film.

(6) The solid-state image pickup apparatus according to (5), in which in a surface of a source of the V-NW transistor forming the transfer section connected to the photoelectric conversion section, a Fermi level is pinned by an impurity diffused from the impurity-containing insulating film.

(7) The solid-state image pickup apparatus according to any one of (1) to (6), in which
the V-NW transistor forms a semiconductor pillar having a diameter of 50 nm or less in a vertical direction with respect to a substrate in a state in which one end of the semiconductor pillar serves as a source, another end thereof serves as a drain, and a gate which controls a conduction state is formed in an outer circumference of the semiconductor pillar.

(8) Electronic equipment mounted with a solid-state image pickup apparatus,
the solid-state image pickup apparatus including:
a photoelectric conversion section that generates and holds a charge in response to incident light;
a transfer section that includes a V-NW transistor (Vertical Nano Wire transistor) and transfers the charge held in the photoelectric conversion section; and
an accumulation section that includes a wiring layer connected to a drain of the transfer section including the V-NW transistor and accumulates the charge transferred by the transfer section.

(9) The electronic equipment according to (8), in which the V-NW transistor forms a semiconductor pillar having a diameter of 50 nm or less in a vertical direction with respect to a substrate in a state in which one end of the semiconductor pillar serves as a source, another end thereof serves as a drain, and a gate which controls a conduction state is formed in an outer circumference of the semiconductor pillar.

(10) A solid-state image pickup apparatus including:
a photoelectric conversion section that generates and holds a charge in response to incident light;
a transfer section that transfers the charge held in the photoelectric conversion section;
an accumulation section that accumulates the charge transferred by the transfer section;
a reset section that resets the charge accumulated in the accumulation section;
an amplification a section that provides the charge accumulated in the accumulation section as an electrical signal; and
a selection section that selectively outputs the electrical signal converted by the amplification section to a latter part, in which at least one of the transfer section, the reset section, the amplification section, or the selection section includes a V-NW transistor (Vertical Nano Wire transistor).

(11) A solid-state image pickup apparatus including:
a photoelectric conversion section that is formed in a substrate;
a transistor that transfers a charge generated in the photoelectric conversion section; and
a wiring layer that is formed on the substrate and connected to the transistor, in which the transistor has a semiconductor area extending in a vertical direction with respect to the substrate, an insulating film formed around the semiconductor area, and a gate formed with the insulating film interposed between the gate and the semiconductor area.

(12) The solid-state image pickup apparatus according to (11), in which the semiconductor area is formed cylindrically, and one end of the semiconductor area is connected to the wiring layer and another end of the semiconductor area is connected to the photoelectric conversion section.

(13) The solid-state image pickup apparatus according to (11) or (12), in which the charge is accumulated in capacitance formed between the wiring layer and the substrate.

REFERENCE SIGNS LIST

11 PD, 12 Transfer gate transistor, 13 FD, 14 Amplification transistor, 15 Selection transistor, 16 n-type diffusion area, 17 Reset transistor, 18 n+-type diffusion layer, 19 n+-type diffusion layer, 22 Read-out transistor, 23 Charge accumulation section, 24 Amplification transistor, 25 Selection transistor, 26 Wiring layer, 27 Reset transistor, 31 Insulating film, 32 Insulating film, 41 Opening part, 51 Semiconductor pillar, 52 Insulating film, 53 Gate electrode, 61 n-type diffusion area

The invention claimed is:

1. A solid-state image pickup apparatus, comprising:
a photoelectric conversion section configured to generate and hold a charge based on incident light;
a transfer section that includes a V-NW transistor (Vertical Nano Wire transistor), wherein the transfer section is configured to transfer the charge held in the photoelectric conversion section;
an accumulation section that includes a wiring layer connected to a drain of the transfer section including the V-NW transistor, wherein
the accumulation section is configured to accumulate the charge transferred by the transfer section, and
the wiring layer has no PN junction; and
an insulating film between the photoelectric conversion section and a gate of the V-NW transistor that forms the transfer section, wherein the insulating film is an impurity-containing insulating film.

2. The solid-state image pickup apparatus according to claim 1, further comprising:
a reset section configured to reset the charge accumulated in the accumulation section;
an amplification section configured to provide the charge accumulated in the accumulation section as an electrical signal; and
a selection section configured to selectively outputs the electrical signal provided by the amplification section to a latter part, wherein at least one of the reset section, the amplification section, or the selection section includes the V-NW transistor.

3. The solid-state image pickup apparatus according to claim 1, wherein
in a surface of a source of the V-NW transistor that forms the transfer section connected to the photoelectric conversion section, a Fermi level is pinned by an impurity diffused from the impurity-containing insulating film.

4. The solid-state image pickup apparatus according to claim 1, wherein
the V-NW transistor comprises a semiconductor pillar that has a diameter of 50 nm or less in a vertical direction with respect to a substrate in a state in which one end of the semiconductor pillar serves as a source, the other end of the semiconductor pillar serves as the drain, and the gate which controls is in an outer circumference of the semiconductor pillar, and
the gate is configured to control a conduction state of the V-NW transistor.

5. A solid-state image pickup apparatus, comprising:
a photoelectric conversion section configured to generate and hold a charge based on to incident light;
a transfer section configured to transfer the charge held in the photoelectric conversion section;
an accumulation section configured to accumulate the charge transferred by the transfer section, wherein
the accumulation section includes a wiring layer connected to a drain of the transfer section including a V-NW transistor (Vertical Nano Wire transistor), and the wiring layer has no PN junction;
an insulating film between the photoelectric conversion section and a gate of the V-NW transistor that forms the transfer section, wherein the insulating film is an impurity-containing insulating film;
a reset section configured to reset the charge accumulated in the accumulation section;
an amplification section configured to provide the charge accumulated in the accumulation section as an electrical signal; and
a selection section configured to selectively output the electrical signal provided by the amplification section to a latter part, wherein at least one of the transfer section, the reset section, the amplification section, or the selection section includes the V-NW transistor.

6. A solid-state image pickup apparatus comprising:
a photoelectric conversion section in a substrate;
a transistor configured to transfer a charge generated in the photoelectric conversion section, wherein
the transistor includes:
a semiconductor area extending in a vertical direction with respect to the substrate,
an insulating film around the semiconductor area, and
a gate formed with the insulating film interposed between the gate and the semiconductor area, and
the insulating film is an impurity-containing insulating film; and
a wiring layer on the substrate and connected to the transistor, wherein the wiring layer has no PN junction.

7. The solid-state image pickup apparatus according to claim 6, wherein
the semiconductor area is cylindrical, and
one end of the semiconductor area is connected to the wiring layer and the other end of the semiconductor area is connected to the photoelectric conversion section.

8. The solid-state image pickup apparatus according to claim 6, wherein the charge is accumulated in capacitance formed between the wiring layer and the substrate.

* * * * *